United States Patent
Choi (10) Patent No.: US 7,697,370 B2
(45) Date of Patent: Apr. 13, 2010

(54) SEMICONDUCTOR MEMORY DEVICE USING MODULATION CLOCK SIGNAL AND METHOD FOR OPERATING THE SAME

(75) Inventor: Hoon Choi, Kyoungki-do (KR)

(73) Assignee: Hynix Semiconductor, Inc., Gyeonggi-do (KR)

(*) Notice: Subject to any disclaimer, the term of this patent is extended or adjusted under 35 U.S.C. 154(b) by 276 days.

(21) Appl. No.: 11/966,721

(22) Filed: Dec. 28, 2007

(65) Prior Publication Data

US 2008/0238506 A1    Oct. 2, 2008

(30) Foreign Application Priority Data

Mar. 30, 2007   (KR) ..................... 10-2007-0031977

(51) Int. Cl.
*G11C 8/00*    (2006.01)
(52) U.S. Cl. ............................. 365/233.12; 365/233.13
(58) Field of Classification Search ............ 365/233.12, 365/233.13; 327/158, 291, 161
See application file for complete search history.

(56) References Cited

U.S. PATENT DOCUMENTS 6,731,667 B1 * 5/2004 Lee et al. .................... 375/130
7,420,361 B2 * 9/2008 Lin et al. ................. 324/76.55
2006/0197565 A1 * 9/2006 Kang ......................... 327/158

FOREIGN PATENT DOCUMENTS

KR    1020060087988    8/2006
KR    1020070031776    3/2007

OTHER PUBLICATIONS

Foreign Office Action issued from Korean Intellectual Property Office on May 21, 2008 with an English translation.

* cited by examiner

*Primary Examiner*—Vu A Le
(74) *Attorney, Agent, or Firm*—IP&T Law Firm PLC (57) ABSTRACT

A semiconductor memory device is capable of performing a modulation of output clock signals in order to prevent EMI characteristics of a system having the semiconductor memory device from being degraded. The semiconductor memory device includes a modulation clock signal generator, a clock input unit, a first modulation unit, a delay locked loop circuit, and a second modulation unit. The modulation clock signal generator generates a modulation clock signal. The clock input unit generates a reference clock signal from a system clock signal. The first modulation unit generates a modulated clock signal by modulating the reference clock signal with the modulation clock signal. The delay locked loop circuit performs a delay locking operation on the modulated clock signal to generate a delay locked clock signal. The second modulation unit modulates the delayed locked clock signal with the modulation clock signal.

25 Claims, 4 Drawing Sheets

SEMICONDUCTOR MEMORY DEVICE USING MODULATION CLOCK SIGNAL AND METHOD FOR OPERATING THE SAME

CROSS-REFERENCE TO RELATED APPLICATIONS

The present invention claims priority of Korean patent application no. 10-2007-0031977, filed in the Korean Patent Office on Mar. 30, 2007, which is incorporated by reference in its entirety.

BACKGROUND OF THE INVENTION

The present invention relates to a semiconductor memory device; and, more particularly, to a delay locked loop (hereinafter, referred to as "DLL") circuit of the semiconductor memory device.

In a system equipped with a plurality of semiconductor devices for performing various functions, a semiconductor memory device functions as an apparatus for storing data. The semiconductor memory device outputs data, which are corresponding to the address signals inputted from a data processing unit (e.g., a central processing unit) to a device that requests the data, or stores data delivered by the data processing unit in unit cells corresponding to the address signals which are inputted together with the data.

The operating speed of systems is getting faster and faster. Therefore, semiconductor memory devices need to have fast input and output speed in the data processing unit. Recently, the operating speed of the data processing unit has been increasing; however, semiconductor memory devices that deliver the data to the data processing unit have not kept pace.

In order to enhance the data I/O speed of the semiconductor memory device, various semiconductor memory devices have been developed. Synchronous memory devices in which the data is inputted and outputted in response to system clock signals have been proposed. The synchronous memory devices output the data to the data processing unit in response to the inputted system clock signals and also receive the data from the data processing unit in response to the inputted system clock signals. However, since the synchronous memory devices are unable to follow the operating speed of the data processing unit, DDR synchronous memory devices have been developed. The DDR synchronous memory devices input and output the data in response to a transition time of the system clock signal. More specifically, in the DDR synchronous memory devices, the data is inputted and outputted in synchronization with rising and falling edges of the system clock signal.

However, the system clock signal inputted into the semiconductor memory device reaches a data output circuit, inevitably resulting in a delay time which is caused by both a clock input buffer disposed within the memory device and a transmission line to transmit the clock signal thereto. Therefore, when the data output circuit outputs the data in synchronization with the system clock signals which already have such a delay time, an external circuit which receives the output data from the semiconductor memory device may take them in asynchronization with the rising edge and the falling edge of the system clock signal.

To solve this problem, the semiconductor memory device includes a delay locked loop for locking an amount of the delay time of the clock signal. The delay locked loop is a circuit that compensates for the delay time caused by the internal circuits in the memory device until the system clock signal is delivered to the data output circuit after being inputted to the memory device. The delay locked loop finds an amount of the delay time of the system clock signal which is caused by delay circuits, such as the input buffer and the clock signal transmission line, and delays the system clock signal based on the delay amount which has been found. The delay locked loop outputs the delayed system clock to the data output circuit. Thus, the system clock signal inputted into the memory device is delivered to the data output circuit with a fixed delay time by the delay locked loop. The data output circuit outputs the data in synchronization with the delay locked clock signal and the external circuit regards the output data as the normal data which is accurately outputted in synchronization with the system clock signal.

In operation, the delay locked clock signal outputted by the delay locked loop is transferred to an output buffer at a point of time which is determined faster than the data output time by one period of time and the data is outputted in synchronization with the transferred delay locked clock signal. As a result, the data is more rapidly outputted than the amount of delay time of the system clock signals caused by the internal circuits of the memory device. In this way, it seems to the external circuit of the memory device that the data is accurately outputted in synchronization with the rising edge and the falling edge of the system clock signal. In conclusion, the delay locked loop is a circuit to find delay value to compensate for the delay time of the system clock signal within the memory device, thereby achieving the fast data output operation.

When the data is outputted in synchronization with the delay locked clock signal from the delay locked loop circuit, the circuit to receive the data can exactly receive them in synchronization with the system clock signal. However, since the delay locked clock signal has a constant frequency, there may be a problem in that an EMI (Electromagnetic Interference) characteristic deteriorates during the data transmission process. If a clock frequency employed when the data is received and transferred between the semiconductor memory device and the data processing apparatus is fixed to one constant frequency, the EMI characteristic may deteriorate. To solve the problem, a system equipped with the semiconductor memory device has a SSC (Spread Spectrum Clock) function. The SSC function is to disperse the power spectrum by modulating the clock signal from the semiconductor memory device. However, when the SSC function does not work appropriately, the EMI characteristic deteriorates because the power spectrum of the clock signal from the semiconductor memory device is distributed with a peak.

SUMMARY OF THE INVENTION

An embodiment of the present invention is directed to providing a semiconductor memory device capable of modulating output clock signals in order to prevent an EMI characteristic of a system having the semiconductor memory device from deteriorating.

Another embodiment of the present invention is directed to providing a semiconductor memory device with a delay locked loop circuit capable of modulating output clock signals.

Still another embodiment of the present invention is directed to providing a semiconductor memory device capable of modulating output clock signals by controlling clock signals which are outputted from a duty correction circuit of a delay locked loop circuit. In accordance with an aspect of the present invention, a semiconductor memory device includes a modulation clock signal generator configured to generate a modulation clock signal, a clock input unit configured to generate a reference clock signal from a system clock signal, a modulation unit configured to generate a modulated clock signal by modulating the reference clock signal with the modulation clock signal, and a delay locked loop circuit configured to perform a delay locking operation on the modulated clock signal to generate a delay locked clock signal.

In accordance with another aspect of the present invention, a method for driving a semiconductor memory device includes generating a modulation clock signal, buffering a system clock signal, modulating the buffered system clock signal with the modulation clock signal, and outputting a modulated clock signal, and generating a delay locked clock signal using the modulated clock signal.

In accordance with further aspect of the present invention, a semiconductor memory device includes a modulation clock signal generator configured to generate a modulation clock signal, a delay locked loop circuit configured to perform a delay locking operation on a system clock signal, thereby generating a delay locked clock signal, and a modulation unit configured to generate a modulated clock signal by modulating the delay locked clock signal with the modulation clock signal.

In accordance with further aspect of the present invention, a semiconductor memory device includes a modulation clock signal generator configured to generate a modulation clock signal, a clock input unit configured to generate a reference clock signal from a system clock signal, a first modulation unit configured to generate a modulated clock signal by modulating the reference clock signal with the modulation clock signal, a delay locked loop circuit configured to perform a delay locking operation on the modulated clock signal to generate a delay locked clock signal, and a second modulation unit configured to modulate the delayed locked clock signal with the modulation clock signal.

In accordance with further aspect of the present invention, a method for driving a semiconductor memory device includes generating a modulation clock signal, modulating a buffered system clock signal in response to the modulation clock signal, thereby outputting a modulated clock signal, generating a delay locked clock signal using the modulated clock signal, and modulating the delay locked clock signal with the modulation clock signal.

In accordance with further aspect of the present invention, a method for driving a semiconductor memory device includes generating a modulation clock signal, generating a delay locked clock signal by performing a delay locking operation on a system clock signal, and modulating the delay locked clock signal in response to the modulation clock signal.

DESCRIPTION OF SPECIFIC EMBODIMENTS

Hereinafter, a semiconductor memory device in accordance with the present invention will be described in detail referring to the accompanying drawings.

Figure 1:
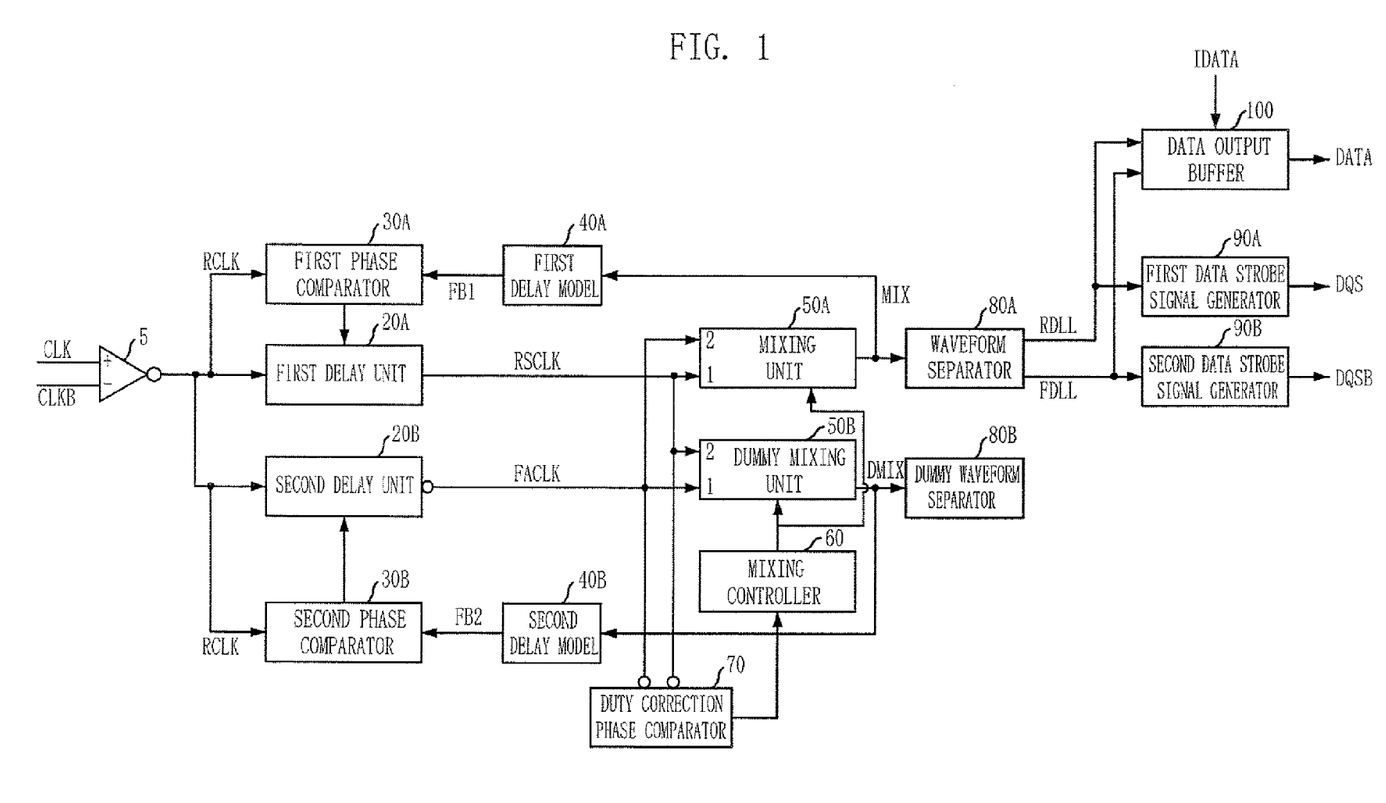
FIG. 1 is a block diagram illustrating a semiconductor memory device.

FIG. 1 is a block diagram illustrating a semiconductor memory device and a delay locked loop circuit. The semiconductor memory device includes a clock input buffer 5, a first delay unit 20A, a second delay unit 20B, a first phase comparator 30A, a second phase comparator 30B, a first delay model 40A, a second delay model 40B, a mixing unit 50A, a dummy mixing circuit 50B, a mixing controller 60, a duty correction phase comparator 70, a waveform separator 80A, a dummy waveform separator 80B, a first data strobe signal generator 90A, a second data strobe signal generator 90B and a data output buffer 100.

The clock input buffer 5 receives system clock signals CLK and CLKB from an external circuit and outputs a reference clock signal RCLK by buffering the received system clock signals CLK and CLKB. The first delay unit 20A outputs a rising clock signal RSCLK by delaying the reference clock signal RCLK by a scheduled delay value. The second delay unit 20B outputs a falling clock signal FACLK by delaying the reference clock signal RCLK by a scheduled delay value and then inverting the delayed reference clock signal RCLK. The mixing unit 50A outputs a mixing clock signal MIX by mixing the rising clock signal RSCLK and the falling clock signal FACLK. Also, the dummy mixing unit 50B outputs a dummy mixing clock signal DMIX by the mixing rising clock signal RSCLK and the falling clock signal FACLK. The duty correction phase comparator 70 compares the duty ratios of the rising clock signal RSCLK and the falling clock signal FACLK and then outputs a corresponding control signal to the mixing controller 60. The mixing controller 60 controls the mixing unit 50A and the dummy mixing unit 50B in response to the control signal from the duty correction phase comparator 70, thereby correcting the duty ratios of the mixing clock signal MIX and the dummy mixing clock signal DMIX.

The first delay model 40A outputs a first feedback clock signal FB1 by delaying the mixing clock signal MIX by a delay value to be modeled. The second delay model 40B outputs the second feedback clock FB2 by delaying the dummy mixing clock signal MIX by a delay value to be modeled. Here, the modeling value is obtained by modeling a delay value until the system clock signal are delivered to data output circuit after being inputted to the semiconductor memory device. The first phase comparator 30A compares the phase of the first feedback clock signal FB1 with that of the reference clock signal RCLK and outputs a corresponding signal to the first delay unit 20A. The first delay unit 20A outputs the rising clock signal RSCLK by controlling a delay value of the reference clock signal RCLK in response to the phase compare result signal outputted from the first phase comparator 30A. The second phase comparator 30B compares the phase of a second feedback clock signal FB2 with that of the reference signal RCLK and outputs a corresponding signal to the second delay unit 20B. The second delay unit 20B outputs the falling clock signal FACLK by controlling the delay value of the reference clock signal RCLK in response to the comparison result outputted from the second phase comparator 30B.

The phase comparison is not performed any more if the clock signals RCLK and FB1 and RCLK and FB2, which are respectively inputted into the first phase comparator 30A and the second phase comparator 30B, are in phase. At this time, the first delay unit 20A and the second delay unit 20B respectively output the rising clock signal RSCLK and the falling clock signal FACLK with the locking operation of the delay value of the reference clock signal RCLK in response to the control signals provided from the first phase comparator 30A and the second phase comparator 30B.

The duty difference between the rising clock signal RSCLK and the falling clock signal FACLK is corrected by the mixing unit 50A, the dummy mixing unit 50B, the mixing controller 60 and the duty correction phase comparator 70, thereby generating the mixing clock signal MIX inputted to the waveform separator 80A. The waveform separator 80A, by using the mixing clock signal MIX, produces a delay locked rising clock signal RDLL synchronized with a rising edge of the mixing clock signal MIX and a delay locked falling clock signal FDLL synchronized with a falling edge the mixing clock signal MIX. The dummy waveform separator 80B receives the dummy mixing clock signal DMIX outputted from the dummy mixing unit 50B. The dummy mixing unit 50B and the dummy waveform separator 80B are not directly required to produce the delay locked clock signals RDLL and FDLL; however, they are dummy blocks to fit a load on the location where the rising clock signal RSCLK and the falling clock signal FACLK are inputted.

The first data strobe signal generator 90A produces a first data strobe signal DQS by using the delay locked rising clock signal RDLL. The second data strobe signal generator 90B produces a second data strobe signal DQSb by using the delay locked falling clock signal FDLL. The data output buffer 100 outputs internal data IDATA, which is provided from the memory core area, in response to the transition of the delay locked rising and falling clock signals RDLL and FDLL, as the output data DATA.

As described above, the DDR synchronous semiconductor memory device outputs the data in response to the rising edge and the falling edge of the system clock signal. If the data output buffer 100 outputs the data in response to the rising edge and falling edge of the system clock signals CLK and CLKB, the data which are delayed by a predetermined time are outputted due to the delay time which occurs until the system clock signals CLK and CLKB are delivered to the data output buffer 100. However, if the data output buffer 100 outputs the data to an external circuit in synchronization with the delay locked clock signals RDLL and FDLL which are produced to compensate for the delay time caused until the system clock signals CLK and CLKB are delivered to the data output buffer 100, it seems to the external circuit of the memory device that the data is accurately outputted in synchronization with the transition timing of the system clock signal.

As mentioned above, the delay locking operation adjusts the delay values of the first delay unit 20A and the second delay unit 20B until the two clock signals RCLK and FB1 inputted to the first phase comparator 30A and the two clock signals RCLK and FB2 inputted to the second phase comparator 30B are in phase. Accordingly, the delay locked state is a state where the two clock signals RCLK and FB1 inputted to the first phase comparator 30A and the two clock signals RCLK and FB2 inputted to the second phase comparator 30B are in phase such that the delay values are not changed any more in the first and second delay units 20A and 20B. At this time, after the rising clock signal RSCLK of the first delay circuit 20A and the falling clock signal FACLK of the second delay circuit 20B are processed by the duty correction circuit which consists of the mixing unit 50A, the dummy mixing unit 50B, the mixing controller 60 and the duty correction phase comparator 70, the delay locked clock signals RDLL and FDLL are produced.

The delay locked clock signals RDLL and FDLL are respectively outputted as the data strobe signals DQS and DQSb after passing through the first and the second data strobe signal generators 90A and 90B. Moreover, the internal data IDATA provided from the memory core area are inputted into the data output buffer 100 and the data output buffer 100 outputs the data DATA to an external circuit in synchronization with the delay locked clock signals RDLL and FDLL.

In this way, when the data and the data strobe signal outputted from the semiconductor memory device always have the same frequency, the EMI characteristics can become degraded. In order to address this, an SSC function is performed in the system having the semiconductor memory device so that frequency modulation of the signals outputted from the semiconductor memory device is performed. However, if the SSC function of a system does not operate properly and the frequency modulation operation is not performed, a phenomenon occurs where the power spectrum of a system is concentrated upon one peak value due to the signals outputted from the semiconductor memory device, so that the EMI characteristics may deteriorate. In the present invention, a semiconductor memory device, which includes the circuit blocks capable of improving the EMI characteristics of a system, is provided.

Figure 2:
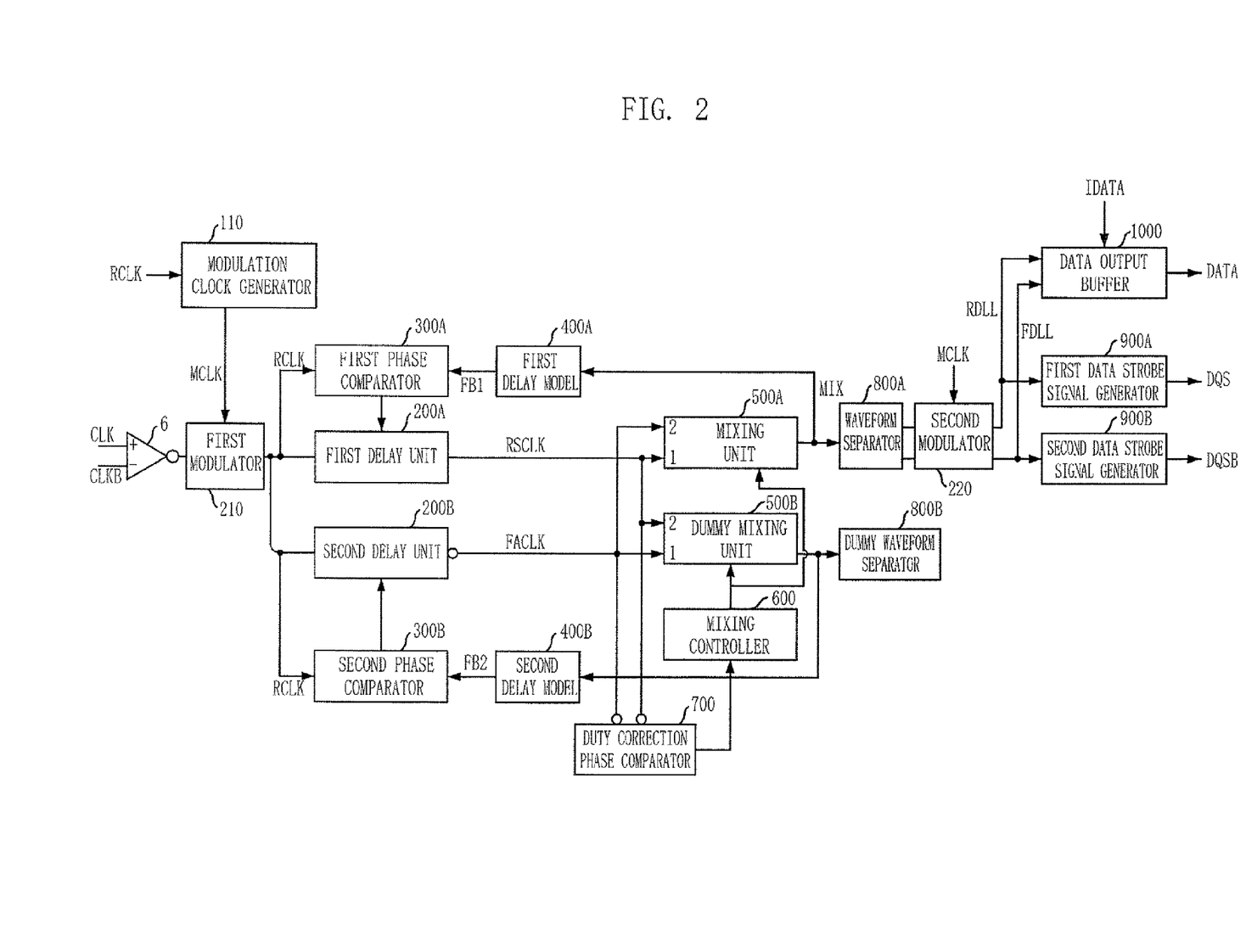
FIG. 2 is a block diagram of a semiconductor memory device in accordance with to a preferred embodiment of the present invention.

FIG. 2 is a block diagram of a semiconductor memory device in accordance with a preferred embodiment of the present invention. The semiconductor memory device according to the preferred embodiment of the present invention includes a clock input buffer 6, a modulation clock generator 110, a first modulator 210, a first delay unit 200A, a second delay unit 200B, a first phase comparator 300A, a second phase comparator 300B, a first delay model 400A, a second delay model 400B, a mixing unit 500A, a dummy mixing unit 500B, a mixing controller 60, a duty correction phase comparator 700, a waveform separator 800A, a dummy waveform separator 800B, a second modulator 220, a first data strobe signal generator 900A, a second data strobe signal generator 900B, and a data output buffer 1000. The blocks to perform the delay locking operation and produce the delay locked clock signals carry out the same operation substantially as those in FIG. 1.

In contrast to the semiconductor memory device of FIG. 1, the semiconductor memory device of FIG. 2 includes the modulation clock signal generator 110 and the first and second modulators 210 and 220.

The modulation clock signal generator 110 produces a modulation clock signal MCLK by dividing the received reference clock signal RCLK. In the preferred embodiment, the reference clock signal RCLK is divided by two, but it is limited.

The first modulator 210 controls the output timing of the clock signals outputted from the clock input buffer 6 in response to the modulation clock signal MCLK. Accordingly, in contrast to the semiconductor memory device of FIG. 1 in which the output signals of the clock input buffer are delivered at the same frequency, the semiconductor memory device of FIG. 2 varies the output signals of the clock input buffer 6 in a predetermined range of frequency through the first modulator 210 and outputs the clock signals to the next stage in such a varied frequency. The frequency is varied so that, as indicated above, the semiconductor memory device can manage the SSC function, (i.e., the EMI characteristic) even though the system is unable to perform such function.

Moreover, the second modulator 220 controls the output timing of the clock signals outputted from the waveform separator 800A in response to the modulation clock signal MCLK. The second modulator 220 is a circuit which is arranged so that the semiconductor memory device mounted on the system can manage a function for improving the EMI characteristic of the system. Here, the range of the frequency is varied in the first and second modulators 210 and 220 to improve the EMI characteristic and the operating specification of the semiconductor memory device.

Figure 3:
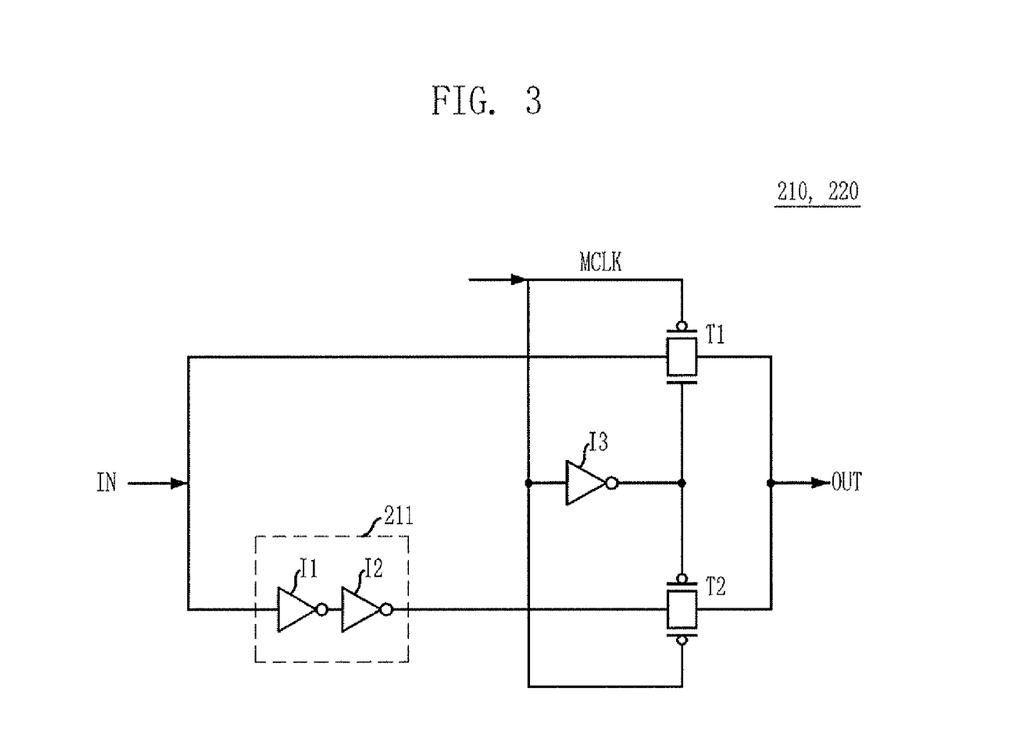
FIG. 3 is a schematic circuit diagram illustrating first and second modulators of FIG. 2.

FIG. 3 is a schematic circuit diagram illustrating the first and second modulators 210 and 220 described in FIG. 2. The circuit of FIG. 3 commonly shows the two modulators of FIG. 2 and, therefore, the second modulator 220 is made up of two circuits, each of which is illustrated in FIG. 3.

Referring to FIG. 3, the modulator includes a delay unit 211 delaying an input clock signal IN, a first transfer gate T1 for transferring the input clock signal IN in response to a first transition of the modulation clock signal MCLK, and a second transfer gate T2 for transferring the clock signals outputted from the delay unit 211 in response to a second transition of the modulation clock signal MCLK.

Figure 4:
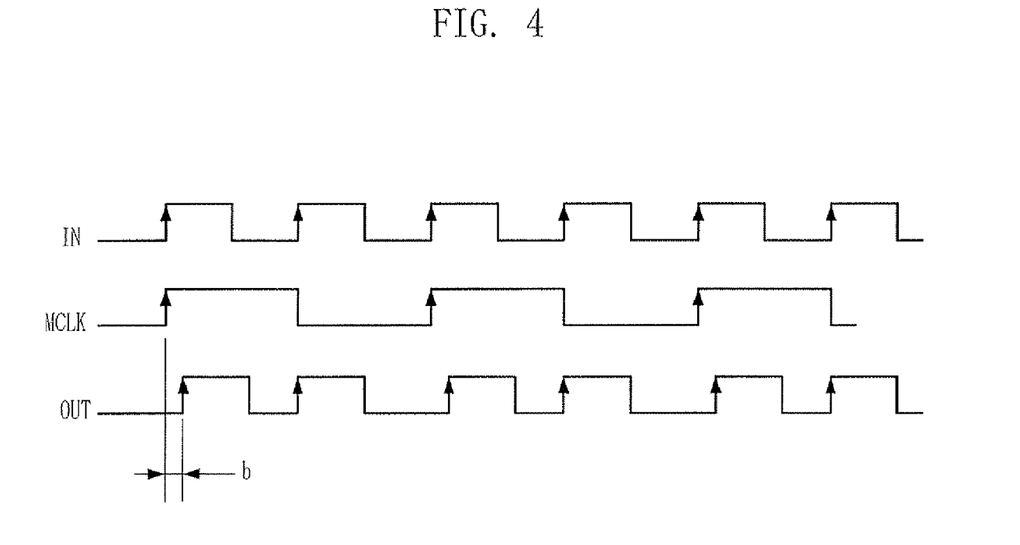
FIG. 4 is a signal timing diagram illustrating an operation of the semiconductor memory device of FIG. 2.

FIG. 4 is a signal timing diagram illustrating the operation of the semiconductor memory device described in FIG. 2, especially the operation of the modulator. Referring to FIG. 4, the input clock signal IN is selectively outputted by the first and second transfer gates T1 and T2 in response to the modulation clock signal MCLK which is produced by dividing the reference clock signal RCLK by two. More specifically, the transition timing point of the output clock signal OUT is continuously changed and the output clock signal OUT is modulated in a range. The section (b) in which the output clock signal of FIG. 4 is delayed can be determined as the delay value defined by the delay unit 211 of FIG. 3.

Moreover, in FIG. 2, the modulators are respectively arranged at input and output terminals of the delay locked loop circuit; however, it is possible to provide one of them at the input or output terminal of the delay locked loop circuit. Moreover, the frequency of the modulation clock signal can be controlled according to the characteristics of the system to which the semiconductor memory device is applied and the delay value of the delay unit 211 of FIG. 3 can be appropriately controlled.

Figure 5:
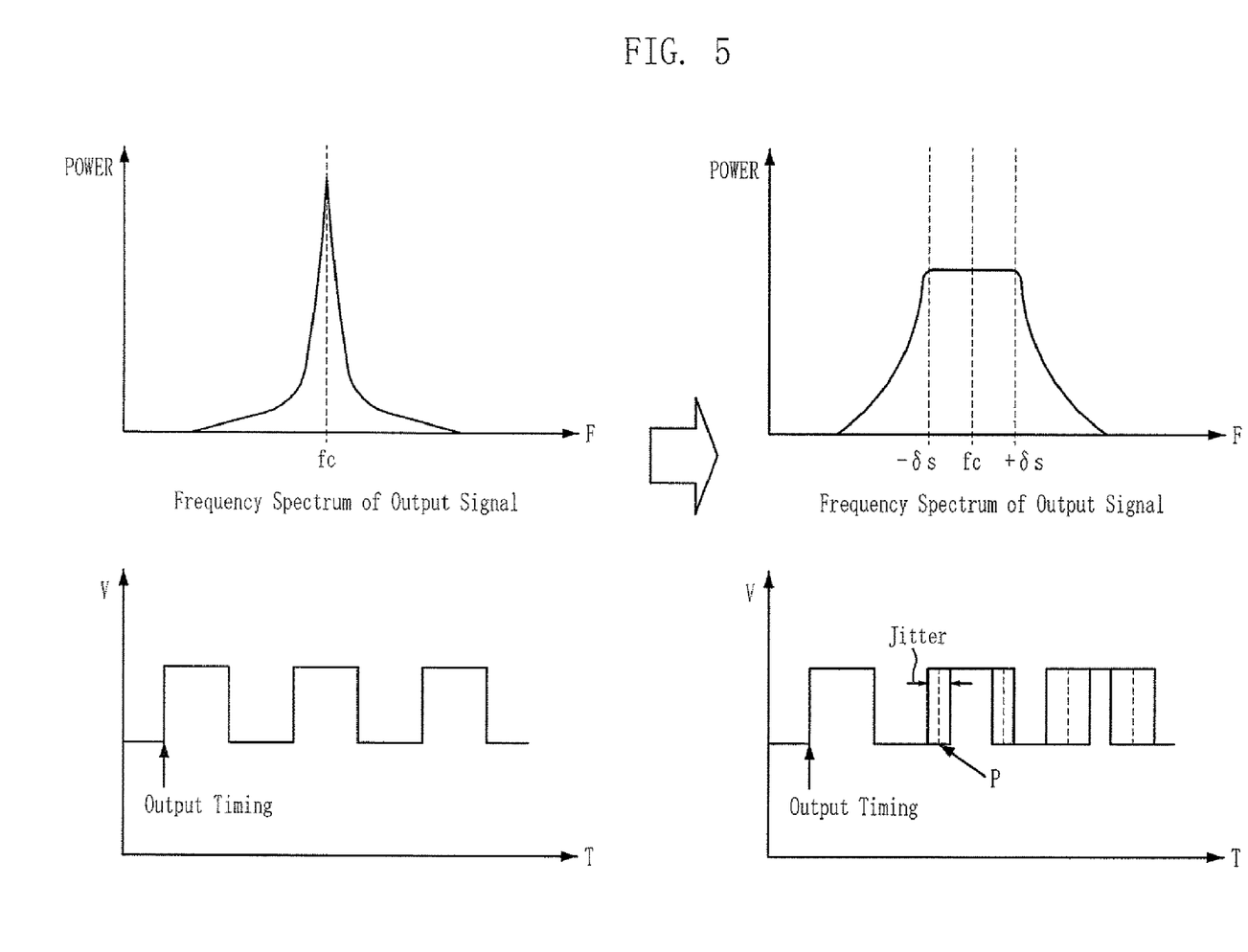
FIG. 5 is a waveform illustrating a modulation operation of the semiconductor memory device in accordance with an embodiment of the present invention.

FIG. 5 is a waveform illustrating the modulation operation of the semiconductor memory device in accordance with the present invention. As shown in the left side of FIG. 5, when the semiconductor memory device outputs the data strobe signal and the data without the frequency modulation, the frequency spectrum of the output signal may have a peak. In this case, the EMI characteristic can deteriorate.

However, in the present invention, as shown in the right side of FIG. 5, if the signals which the semiconductor memory device outputs are modulated by the frequency modulation, the frequency spectrum of the output signal does not have such a peak. Therefore, the EMI characteristic can be improved in view of the system.

As apparent from the above, the semiconductor memory device according to the present invention can adjust the modulation of the output signals, enhancing EMI characteristics of the system. In particular, the present invention has a relatively large effect on a system which does not control the clock signal modulation.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a modulation clock signal generator configured to generate a modulation clock signal;
   a clock input unit configured to generate a reference clock signal from a system clock signal;
   a modulation unit configured to generate a modulated clock signal by modulating the reference clock signal with the modulation clock signal; and
   a delay locked loop circuit configured to perform a delay locking operation on the modulated clock signal to generate a delay locked clock signal.

2. The semiconductor memory device of claim 1, further comprising a data strobe signal generating unit configured to output the delay locked clock signal as a data strobe signal.

3. The semiconductor memory device of claim 1, further comprising a data output buffer configured to output data in response to the delay locked clock signal.

4. The semiconductor memory device of claim 1, wherein the delay locked loop circuit includes:
   a first phase comparator configured to compare the phase of the modulated clock signal with that of a first feedback clock signal;
   a first delay unit configured to output a first delay locked clock signal by delaying the modulated clock signal by a delay value which corresponds to a comparison result of the first phase comparator;
   a first delay model configured to output the first feedback clock signal by delaying the first delay locked clock signal by a modeling value;
   a second phase comparator configured to compare the phase of the modulated clock signal with that of a second feedback clock signal;
   a second delay circuit configured to output a second delay locked clock signal by delaying the modulated clock signal by a delay value which corresponds to a comparison result of the second phase comparator and inverting the delayed clock signal; and
   a second delay model configured to output the second feedback clock signal by delaying the second delay locked clock signal by a modeling value.

5. The semiconductor memory device of claim 1, wherein the modulation unit includes:
   a delay unit configured to delay the reference clock signal by a scheduled delay value;
   a first transfer gate configured to selectively transfer the reference clock signal in response to a first transition of the modulation clock signal; and
   a second transfer gate configured to selectively transfer an output signal of the delay unit in response to a second transition of the modulation clock signal.

6. A method for driving a semiconductor memory device comprising:
   generating a modulation clock signal;
   buffering a system clock signal;
   modulating the buffered system clock signal with the modulation clock signal, and outputting a modulated clock signal; and
   generating a delay locked clock signal using the modulated clock signal.

7. The method of claim 6, further comprising outputting the delay locked clock signal as a data strobe signal.

8. The method of claim 7, further comprising outputting data to an external circuit in response to the delay locked clock signal.

9. The method of claim 6, wherein the modulating the buffered system clock signal includes:
   delaying the buffered system clock signal by a scheduled delay value to generate a delayed system clock signal;

transferring the buffered system clock signal to an output terminal in response to a first transition of the modulation clock signal; and transferring the delayed system clock signal to the output terminal in response to a second transition of the modulation clock signal.

10. A semiconductor memory device comprising:
a modulation clock signal generator configured to generate a modulation clock signal;
a delay locked loop circuit configured to perform a delay locking operation on a system clock signal to generate a delay locked clock signal; and
a modulation unit configured to generate a modulated clock signal by modulating the delay locked clock signal with the modulation clock signal.

11. The semiconductor memory device of claim 10, further comprising a data strobe signal generating unit configured to output the modulated clock signal as a data strobe signal.

12. The semiconductor memory device of claim 10, further comprising a data output buffer configured to output data in response to the modulated clock signal.

13. The semiconductor memory device of claim 10, wherein the delay locked loop circuit includes:
a clock signal input unit configured to output a reference clock signal in response to the system clock signal;
a first phase comparator configured to compare the phase of a first feedback clock signal with that of the reference clock signal;
a first delay unit configured to output a first delay locked clock signal by delaying the reference clock signal by a delay value which corresponds to a comparison result of the first phase comparator;
a first delay model configured to output the first feedback clock signal by delaying the first delay locked clock signal by a modeling value;
a second phase comparator configured to compare the phase of a second feedback clock signal with that of the reference clock signal;
a second delay circuit configured to output a second delay locked clock signal by delaying the reference clock signal by a delay value which corresponds to a comparison result of the second phase comparator and inverting the delayed reference clock signal; and
a second delay model configured to output the second feedback clock signal by delaying the second delay locked clock signal by a modeling value.

14. The semiconductor memory device of claim 10, wherein the modulation unit includes:
a delay unit configured to delay the delay locked clock signal by a scheduled delay value;
a first transfer gate configured to selectively transfer the delay locked clock signal in response to a first transition of the modulation clock signal; and
a second transfer gate configured to selectively transfer an output signal of the delay unit in response to a second transition of the modulation clock signal.

15. A semiconductor memory device comprising:
a modulation clock signal generator configured to generate a modulation clock signal;
a clock input unit configured to generate a reference clock signal from a system clock signal;
a first modulation unit configured to generate a modulated clock signal by modulating the reference clock signal with the modulation clock signal;
a delay locked loop circuit configured to perform a delay locking operation on the modulated clock signal to generate a delay locked clock signal; and
a second modulation unit configured to modulate the delayed locked clock signal with the modulation clock signal.

16. The semiconductor memory device of claim 15, further comprising a data strobe signal generating unit configured to output the modulated delay locked clock signal as a data strobe signal.

17. The semiconductor memory device of claim 15, further comprising a data output buffer configured to output data in response to the modulated delay locked clock signal.

18. The semiconductor memory device of claim 15, wherein the delay locked loop circuit includes:
a first phase comparator configured to compare the phase of the modulated clock signal with that of a first feedback clock signal;
a first delay circuit configured to output a first delay locked clock signal by delaying the modulated clock signal by a delay value which corresponds to a comparison result of the first phase comparator;
a first delay model configured to output the first feedback clock signal by delaying the first delay locked clock signal by a modeling value;
a second phase comparator configured to compare the phase of the modulated clock signal with that of a second feedback clock signal;
a second delay circuit configured to output a second delay locked clock signal by delaying the modulated clock signal by a delay value which corresponds to a comparison result of the second phase comparator and inverting the delayed clock signal; and
a second delay model configured to output the second feedback clock signal by delaying the second delay locked clock signal by a modeling value.

19. The semiconductor memory device of claim 15, wherein the first modulation unit includes:
a delay unit configured to delay the reference clock signal by a scheduled delay value;
a first transfer gate configured to selectively transfer the reference clock signal in response to a first transition of the modulation clock signal; and
a second transfer gate configured to selectively transfer an output signal of the delay unit in response to a second transition of the modulation clock signal.

20. The semiconductor memory device of claim 15, wherein the second modulation unit includes:
a delay unit configured to delay the delay locked clock signal by a scheduled delay value;
a first transfer gate configured to selectively transfer the delay locked clock signal in response to a first transition of the modulation clock signal; and
a second transfer gate configured to selectively transfer an output signal of the delay unit in response to a second transition of the modulation clock signal.

21. A method for driving a semiconductor memory device comprising:
generating a modulation clock signal;
modulating a buffered system clock signal in response to the modulation clock signal, thereby outputting a modulated clock signal;
generating a delay locked clock signal using the modulated clock signal; and
modulating the delay locked clock signal with the modulation clock signal.

22. The method of claim 21, further comprising outputting the modulated delay locked clock signal as a data strobe signal.

23. The method of claim 21, further comprising outputting data to an external circuit in response to the modulated delay locked clock signal.

24. The method of claim 21, wherein the modulating the buffered system clock signal includes:
- delaying the buffered system clock signal by a scheduled delay value to generate a delayed system clock signal;
- transferring the buffered system clock signal to an output terminal in response to a first transition of the modulation clock signal; and
- transferring the delayed system clock signal to the output terminal in response to a second transition of the modulation clock signal.

25. The method of claim 21, wherein the modulating the delay locked clock signal includes:
- delaying the delay locked clock signal by a scheduled delay value;
- transferring the delay locked clock to an output terminal in response to a first transition of the modulated clock signal; and
- transferring the delayed-delay locked clock signal to the output terminal in response to a second transition of the modulated clock signal.

* * * * *